US009306120B2

(12) United States Patent
Kim et al.

(10) Patent No.: US 9,306,120 B2
(45) Date of Patent: Apr. 5, 2016

(54) HIGH EFFICIENCY LIGHT EMITTING DIODE

(71) Applicant: SEOUL VIOSYS CO., LTD., Ansan-si (KR)

(72) Inventors: Da Hye Kim, Ansan-si (KR); Jong Kyun You, Ansan-si (KR); Chang Yeon Kim, Ansan-si (KR); Tae Hyuk Im, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/085,092

(22) Filed: Nov. 20, 2013

(65) Prior Publication Data

US 2014/0138729 A1 May 22, 2014

(30) Foreign Application Priority Data

Nov. 21, 2012 (KR) .................. 10-2012-0132209

(51) Int. Cl.
| | |
|---|---|
| *H01L 33/02* | (2010.01) |
| *H01L 33/22* | (2010.01) |
| *H01L 33/00* | (2010.01) |
| *H01L 33/20* | (2010.01) |
| *H01L 33/44* | (2010.01) |

(52) U.S. Cl.
CPC ............ *H01L 33/22* (2013.01); *H01L 33/0079* (2013.01); *H01L 33/0095* (2013.01); *H01L 33/20* (2013.01); *H01L 33/44* (2013.01); *H01L 2933/0025* (2013.01)

(58) Field of Classification Search
USPC .......... 257/78, 79, 95–99, 103, 680, E33.005, 257/E33.023, E33.064, E33.067; 438/27, 438/46
See application file for complete search history.

(56) References Cited

U.S. PATENT DOCUMENTS

| | | | |
|---|---|---|---|
| 2003/0141506 A1* | 7/2003 | Sano et al. ................. | 257/78 |
| 2006/0118802 A1* | 6/2006 | Lee et al. .................. | 257/98 |
| 2007/0257269 A1* | 11/2007 | Cho .................. | H01L 33/20 257/95 |
| 2008/0035953 A1* | 2/2008 | Beom et al. ................. | 257/103 |

* cited by examiner

*Primary Examiner* — Kimberly Rizkallah
*Assistant Examiner* — Bo Bin Jang
(74) *Attorney, Agent, or Firm* — H.C. Park & Associates, PLC (57) ABSTRACT

A method of fabricating method light-emitting diode according to an exemplary embodiment of the present invention includes forming a first conductivity-type semiconductor layer, an active layer, and a second conductivity-type semiconductor layer on a first substrate, forming a second substrate on the second conductivity-type semiconductor layer, separating the first substrate from the first conductivity-type semiconductor layer, forming a mask pattern including a plurality of openings on the first conductivity-type semiconductor layer exposed after separating the substrate, etching the first conductivity-type semiconductor layer having the mask pattern disposed thereon to form a plurality of recesses separated from each other, removing the mask pattern, and etching a surface of the first conductivity-type semiconductor layer to form a sub-micro texture.

16 Claims, 7 Drawing Sheets

(iii)

Figure 10

HIGH EFFICIENCY LIGHT EMITTING DIODE

CROSS-REFERENCE TO RELATED APPLICATION

This application claims priority from and the benefit of Korean Patent Application No. 10-2012-0132209, filed on Nov. 21, 2012, which is hereby incorporated by reference for all purposes as if fully set forth herein.

BACKGROUND

1. Field

Exemplary embodiments of the present invention relate to a high efficiency light emitting diode and, more particularly, to a high efficiency light emitting diode having improved light extraction efficiency and a method of fabricating the same.

2. Discussion of the Background

A light emitting diode is a semiconductor device that emits light by recombination of electrons and holes in a junction between a P-type semiconductor and an N-type semiconductor. Particularly, a light emitting diode using group III-V based semiconductors such as gallium nitride (GaN) has a direct transition-type energy band structure and may have high internal quantum efficiency. Among group III-V based semiconductors, a gallium nitride semiconductor has attracted attention as a material for light emitting diodes.

Luminous efficiency of light emitting diodes is generally determined by internal quantum efficiency and light extraction efficiency. Light extraction efficiency means a ratio of photons emitted outside of a light emitting diode, that is, a free space, to photons emitted from an active layer. When the light emitting diode has low light extraction efficiency, the number of photons escaping to the free space is low even when the light emitting diode has high internal quantum efficiency. As a result, a light emitting diode having low light extraction efficiency exhibits low efficiency as an actual light source.

Light extraction efficiency is decreased by total internal reflection due to a difference in index of refraction between the light emitting diode and free space. Due to such total internal reflection, photons generated in the active layer are extinguished inside the light emitting diode instead of escaping to the outside of the light emitting diode.

In order to reduce optical loss due to total internal reflection, various techniques have been developed. For example, surface roughness of the light emitting diode may be increased to reduce total internal reflection at the surface of the light emitting diode. In particular, increased density of surface roughness may further reduce total internal reflection. To increase surface roughness of the light emitting diode, dry etching or wet etching may be used.

It may be difficult to provide relatively dense surface roughness using dry etching due to a limit in photolithography, and wet etching may be used instead. However, when the light emitting diode has a stable surface, it may be difficult to increase surface roughness via wet etching. For example, an N-face surface may be more stable than a Ga-face surface in a gallium nitride-based semiconductor, so it may be difficult to increase the surface roughness of the N-face surface of the light emitting diode by wet etching.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting diode having improved surface roughness and a method of fabricating the same.

Exemplary embodiments of the present invention also provide a method of fabricating a light emitting diode, which can increase surface roughness through a stable process.

Additional features of the invention will be set forth in the description which follows, and in part will be apparent from the description, or may be learned by practice of the invention.

An exemplary embodiment of the present invention discloses a method of fabricating a light emitting diode including forming a first conductivity-type semiconductor layer, an active layer, and a second conductivity-type semiconductor layer on a first substrate, forming a second substrate on the second conductivity-type semiconductor layer, separating the first substrate from the first conductivity-type semiconductor layer, forming a mask pattern having a plurality of openings on the first conductivity-type semiconductor layer exposed after the first substrate is separated, etching the first conductivity-type semiconductor layer having the mask pattern disposed thereon to form a plurality of recesses separated from each other, removing the mask pattern, etching a surface of the first conductivity-type semiconductor layer to form a sub-micro texture, and forming a passivation layer on the first conductivity-type semiconductor layer, the active layer, and the second conductivity-type semiconductor layer, wherein the passivation layer is formed in the recesses and on a surface of the sub-micro texture, and has a gently inclined surface relative to the surface of the sub-micro texture.

An exemplary embodiment of the present invention also discloses a light emitting diode including a support substrate, a second conductivity-type semiconductor layer disposed on the support substrate, a first conductivity-type semiconductor layer disposed on the second conductivity-type semiconductor layer, an active layer disposed between the first conductivity-type semiconductor layer and the second conductivity-type semiconductor layer, and a passivation layer disposed on the first conductivity-type semiconductor layer, the second conductivity-type semiconductor layer, and the active layer, wherein the first conductivity-type semiconductor layer includes a plurality of recesses separated from each other and a sub-micro texture disposed in the recesses on a surface of the first conductivity-type semiconductor layer opposite to the support substrate, and the passivation layer disposed on the first conductivity-type semiconductor layer is disposed in the recesses and on a surface of the sub-micro texture, and the passivation layer has a gently inclined surface relative to the surface of the sub-micro texture.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of the present invention will become apparent from the detailed description of the following exemplary embodiments in conjunction with the accompanying drawings.

DETAILED DESCRIPTION OF THE ILLUSTRATED EMBODIMENTS

Exemplary embodiments of the present invention will be described in more detail with reference to the accompanying drawings. It should be understood that the following exemplary embodiments are given by way of illustration only to provide thorough understanding of the invention to those skilled in the art. Therefore, the present invention is not limited to the following exemplary embodiments and may be embodied in different ways. Further, like components will be denoted by like reference numerals throughout the specification, and the widths, lengths, and thicknesses of certain elements, layers or features may be exaggerated for clarity.

It will be understood that when an element is referred to as being disposed "above" or "on" another element, it can be directly disposed on the other element, or an intervening layer(s) may also be present. Like components will be denoted by like reference numerals throughout the specification. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1:
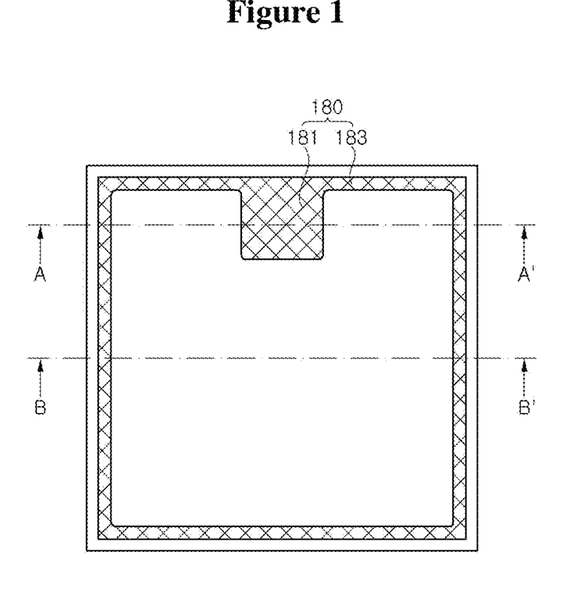
FIG. 1, FIG. 2, and FIG. 3 are a top view and cross-sectional views of a light emitting diode in accordance with an exemplary embodiment of the present invention.
Figure 2:
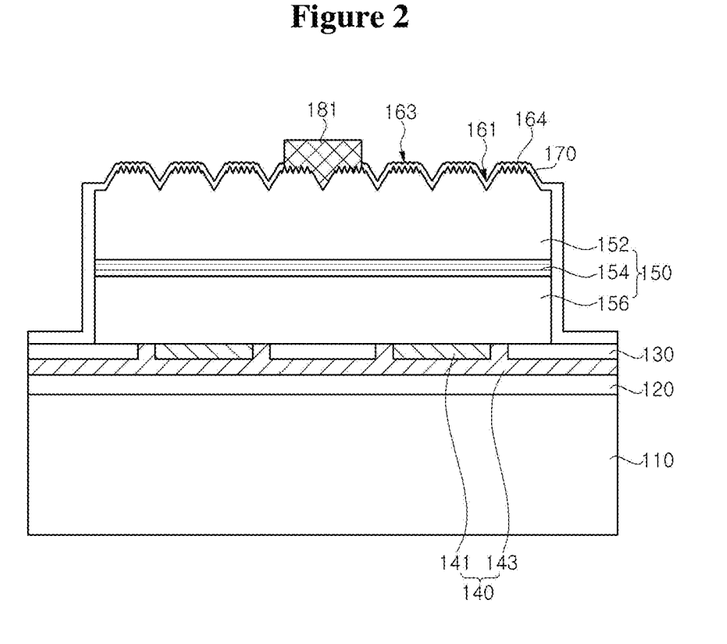
Figure 3:
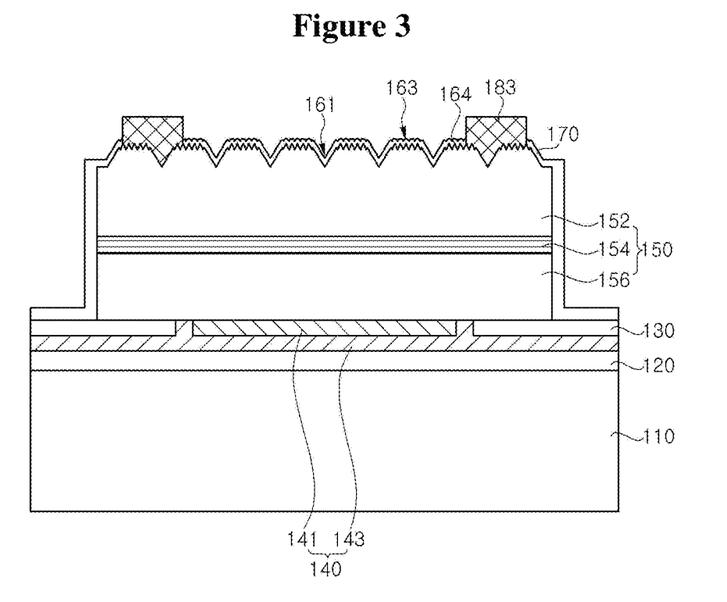

FIG. 1, FIG. 2, and FIG. 3 are a top view and cross-sectional views of a light emitting diode in accordance with an exemplary embodiment of the present invention.

FIG. 1 is a top view of a light emitting diode according to an exemplary embodiment of the invention, FIG. 2 is a cross-sectional view taken along line A-A' of FIG. 1, and FIG. 3 is a cross-sectional view taken along line B-B' of FIG. 1.

Referring to FIG. 1 and FIG. 2, the light emitting diode according to the present exemplary embodiment includes a support substrate 110, a semiconductor structure 150, a bonding layer 120, an insulating pattern layer 130, and a metal layer 140. The light emitting diode may further include an electrode 180 and a passivation layer 170. The electrode 180 may include an electrode pad 181 and an electrode extension 183 extending from the electrode pad 181.

The support substrate 110 serves to support the semiconductor structure 150, and any substrate may be used as the support substrate 110 so long as the substrate can support the semiconductor structure 150. For example, the support substrate 110 may be a silicon substrate, a glass substrate, a conductive substrate containing a metallic material, a circuit substrate such as a printed circuit board (PCB), or a ceramic substrate. According to the present exemplary embodiment, the support substrate 110 may be a conductive or insulating substrate. When the support substrate 110 is an insulating substrate, the light emitting diode may further include a conductive material portion (not shown) that electrically connects the semiconductor structure 150. When the support substrate 110 is conductive, the support substrate 110 may act as an electrode electrically connected to a second conductivity-type semiconductor layer 156.

The semiconductor structure 150 is arranged on the support substrate 110, and includes a first conductivity-type semiconductor layer 152, a second conductivity-type semiconductor layer 156, and an active layer 154.

Here, the first conductivity-type semiconductor layer 152 and the second conductivity-type semiconductor layer 156 are different conductivity-type semiconductor layers. In the present exemplary embodiment, for example, the first conductivity-type semiconductor layer 152 may include an n-type semiconductor layer and the second conductivity-type semiconductor layer may include a p-type semiconductor layer, or vice versa. Both the first and second conductivity-type semiconductor layers 152, 156 may include nitride-based semiconductor layers, including (Al, Ga, In)N. In addition, each of the first and second conductivity-type semiconductor layers 152, 156 may include a single layer or multiple layers. For example, each of the first and second conductivity-type semiconductor layers 152, 156 may include a clad layer and a contact layer, and may include a superlattice layer.

The active layer 154 is disposed between the first conductivity-type semiconductor layer 152 and the second conductivity-type semiconductor layer 156. The active layer 154 may include a single quantum well structure having a single light emitting layer, or a multi-quantum well structure having a plurality of light emitting layers and barrier layers. In addition, the active layer 154 may include a nitride semiconductor layer, the composition of which is adjusted to emit light having a desired peak wavelength.

Further, the second conductivity-type semiconductor layer 156 may further include an electron blocking layer (EBL) arranged at the active layer 154 side to further improve internal quantum efficiency of the light emitting diode.

In the present exemplary embodiment, the first conductivity-type semiconductor layer 152 may include a plurality of recesses 161 and a sub-micro texture 164.

The recesses 161 may be formed on an upper surface of the first conductivity-type semiconductor layer 152 corresponding to a light extraction face of the semiconductor structure 150. In addition, the recesses 161 may be separated from each other. As shown, the recesses 161 may be formed on the overall upper surface of the first conductivity-type semiconductor layer 152, or may be formed on the upper surface thereof excluding a region on which the electrode pad 181 is disposed.

The recesses 161 may include micro-conical recesses, and each of the micro-conical recesses 161 may have a circular or hexagonal inlet. Other shapes are possible. In some cases, different recesses 161 may have different shapes from one another. In addition, the recesses 161 may be formed such that a single recess 161 is surrounded by multiple recesses, such as, for example, six other recesses 161. The recesses 161 may have a center-to-center pitch of, for example, about 6 µm, and a depth of, for example, about 3 µm.

The sub-micro texture 164 may be formed on the upper surface of the first conductivity-type semiconductor layer 152 on a region where the recesses 161 are not formed, that is, in a region between the recesses 161.

As shown in FIG. 2, the sub-micro texture 164 may include sub-micro cones. The sub-micro texture 164 may have a smaller size than the recesses 161. For example, the sub-micro cones may have an average height of 0.5 µm or less. In addition, although a lower limit of the average height of the sub-micro cones is not particularly defined, the average height of the sub-micro cones may be greater than a wavelength of light within the first conductivity-type semiconductor layer 152 (wavelength in air/index of refraction of the first conductivity-type semiconductor layer is represented as λ/n) in order to allow the sub-micro cones to improve light extraction.

The sub-micro texture 164 may be formed between the recesses 161 over a substantial region of the upper surface of the first conductivity-type semiconductor layer 152. For example, as shown, the sub-micro texture 164 may be formed on the overall upper surface of the first conductivity-type semiconductor layer 152 between the recesses 161. Alternatively, the sub-micro texture 164 may be formed over the upper surface of the first conductivity-type semiconductor layer 164 excluding the recesses 161 and the region on which the electrode pad 181 is formed. Further, the sub-micro texture 164 may be formed within the recesses 161.

When the sub-micro cones are formed within the recesses 161, the sub-micro texture 164 may be formed on the overall upper surface of the first conductivity-type semiconductor layer 152. As a result, the light emitting diode may have further improved light extraction efficiency.

When the recesses 161 have a micro-conical shape and the sub-micro texture 164 includes the sub-micro cones, the micro-conical recesses 161 may have a gentler side slope than the sub-micro cones. For example, as shown in FIG. 9b(iii), the micro-conical recesses may have a "U"-shape cross-section, and the sub-micro cones may have an inverted "V"-shape cross-section. However, the recesses 161 and the sub-micro texture 164 may have various shapes.

The light emitting diode according to the present exemplary embodiment includes the recesses 161 and the sub-micro texture 164 formed on the upper surface of the first conductivity-type semiconductor layer 152, that is, on the light extraction face of the light emitting diode, thereby improving light extraction efficiency. In addition, since the sub-micro texture 164 having a relatively small size is formed on the region between the recesses 161, total internal reflection of the light emitting diode can be reduced.

The bonding layer 120 may be arranged between the metal layer 140 and the support substrate 110. The bonding layer 120 may bond the semiconductor structure 150 to the support substrate 110. In addition, as described below, the metal layer 140 and the insulating pattern layer 130 may be further arranged between the bonding layer 120 and the semiconductor structure 150.

Any material may be used for the bonding layer 120 without limitation so long as the material can bond the support substrate 110 to the semiconductor structure 150. In the present exemplary embodiment, the bonding layer 120 may be formed of a conductive material, for example, a metallic material including AuSn. Here, AuSn may be formed by eutectic bonding, and may include a eutectic structure. Since the bonding layer 120 is formed of the conductive material, the bonding layer can electrically connect the support substrate 110 to the second conductivity-type semiconductor layer 156. In addition, when the conductive material includes AuSn, the bonding layer may easily transfer heat from the semiconductor structure 150 to the support substrate 110, thereby improving heat dissipation of the light emitting diode.

The insulating pattern layer 130 may be arranged between the bonding layer 120 and the semiconductor structure 150, and may be partially formed on the support substrate 110. As shown in FIG. 2, the insulating pattern layer 130 may be disposed below the electrode pad 181, whereby current crowding can be prevented under the electrode pad 181, thereby improving current spreading effects. In addition, the insulating pattern layer 130 may be arranged under an outer peripheral side surface of the semiconductor structure 150, and thus may act as a mark indicating an etch end point when forming a light emitting element including the semiconductor structure 150 in fabrication of the light emitting diode.

Referring to FIG. 3, which is a cross-sectional view taken along line B-B' of FIG. 1, the insulating pattern layer 130 is disposed only under the outer peripheral side surface of the semiconductor structure 150. In the sectional view of FIG. 3, since the electrode extension 183 of the light emitting diode is disposed on the outer peripheral side surface of the semiconductor structure 150, the insulating pattern layer 130 may be disposed directly under the electrode extension 183.

The insulating pattern layer 130 may be formed of a different material than that of the semiconductor structure 150. For example, the insulating pattern layer 130 may include $SiO_2$ or $SiN_x$.

The metal layer 140 may be arranged between the semiconductor structure 150 and the bonding layer 120, and may include a reflective metal layer 141 and a barrier metal layer 143.

The reflective metal layer 141 may be disposed on partial regions of the bonding layer 120. For example, as shown, the reflective metal layer 141 may be arranged on a region on which the insulating pattern layer 130 is not formed. The barrier metal layer 143 may be arranged on the reflective metal layer 141. In addition, as shown in FIG. 2, the barrier metal layer 143 may cover a side surface of the reflective metal layer 141. Further, the barrier metal layer 143 may be formed to cover not only the reflective metal layer 141 but also the insulating pattern layer 130, whereby the barrier metal layer 143 may have a relatively flat lower surface. Since the lower surface of the barrier metal layer 143 is flat, bonding between the semiconductor structure 150 and the support substrate 110 by the bonding layer 120 may be facilitated.

Referring to FIG. 3, in the sectional view taken along line B-B', the electrode extension 183 is illustrated as being formed only on the outer peripheral side surface of the semiconductor structure 150. Thus, the reflective metal layer 141 is formed as a continuous single layer on a region excluding the region on which the insulating pattern layer 130 is disposed.

The reflective metal layer 141 may be in ohmic contact with the second conductivity-type semiconductor layer 156 and may reflect light emitted from the active layer 154. Accordingly, the reflective metal layer 141 may be formed of a material having high reflectivity and capable of forming ohmic contact. For example, the reflective metal layer 141 may include at least one selected from among Ni, Pt, Pd, Rh, W, Ti, Al, Ag, and Au.

The barrier metal layer 143 covers the reflective metal layer 141 to protect the reflective metal layer 141. Particularly, the barrier metal layer 143 prevents diffusion of the reflective metal layer 141 material into the bonding layer 120 material, and vice versa. If the reflective metal layer 141 material diffuses into or is mixed with exterior metallic materials, the reflective metal layer 141 may suffer from deterioration in reflectivity and increase in contact resistance. Accordingly, the barrier metal layer 143 may completely cover the reflective metal layer 141. The barrier metal layer 143 may include Ni, and may include multiple layers.

The light emitting diode may further include a Schottky barrier metal layer (not shown) between the metal layer 140 and the insulating pattern layer 130.

The passivation layer 170 may be formed to cover the semiconductor structure 150, and may cover all of upper and side surfaces of the semiconductor structure 150. The passivation layer 170 protects the semiconductor structure 150 from an exterior environment.

The passivation layer 170 may include $TiO_2$, $Al_2O_3$, or $SiN_x$, and may have a multilayer structure including $SiO_2$ or $SiN_x$. In addition, the passivation layer 170 arranged on the side surface of the semiconductor structure 150 may be formed as a distributed Bragg reflector (DBR) by repeating $SiO_2$ and $TiO_2$ layers. In this case, light can be reflected by the DBR on the side surface of the semiconductor structure 150, whereby most light can be emitted to the outside through the upper surface of the first conductivity-type semiconductor layer 152.

A portion of the passivation layer 170 formed on the upper surface of the first conductivity-type semiconductor layer 152 may be formed along the upper surface of the first conductivity-type semiconductor layer 152. In other words, the passivation layer 170 may be formed in a shape corresponding to a concavo-convex shape of the recesses 161 and the sub-micro texture 164.

In addition, the sub-micro texture 164 may include sub-micro cones, and the passivation layer 170 may include a conical portion formed on the sub-micro cones.

The conical portion may be formed to have a gentler slope than the sub-micro cones. In addition, during fabrication, the sub-micro cones may be divided or irregularly combined with each other, and the conical portion formed on the divided or combined sub-micro cones may be formed in a shape having a gentle slope.

In this way, when the passivation layer 170 is formed on the first conductivity-type semiconductor layer 152, the slope of the cone shapes on the light extraction face may become gentle, thereby improving light extraction efficiency.

In addition, the passivation layer 170 may have various thicknesses according to locations of the sub-micro cones under the passivation layer 170. For example, a portion of the passivation layer 170 disposed on an apex of the sub-micro cone may be thicker than a portion of the passivation layer 170 disposed on a side surface of the sub-micro cone. As a result, the slope of the cone shapes of the light extraction face becomes gentle, thereby further improving light extraction efficiency.

Further, the passivation layer 170 may include an exposed region so as to form the electrode pad 181 and the electrode extension 183.

The electrode pad 181 is disposed on the upper surface of the first conductive type semiconductor layer 152. According to the present exemplary embodiment, the sub-micro texture 164 is formed on the upper surface of the first conductivity-type semiconductor layer 152 under the electrode pad 181. The sub-micro texture 164 may be present on the upper surface of the first conductivity-type semiconductor layer 152 under the electrode pad 181. The electrode pad 181 may be electrically connected to a power source (not shown) to electrically connect the semiconductor structure 150 thereto. In FIG. 3, the electrode extension 183 may be arranged along an outer peripheral line on the upper surface of the semiconductor structure 150 and spreads electric current to improve luminous efficacy.

FIG. 4, FIG. 5, FIG. 6a, FIG. 6b, FIG. 7, FIG. 8, FIG. 9a, FIG. 9b, and FIG. 10 are cross-sectional views, a perspective view, and an SEM image illustrating a method of fabricating a light emitting diode in accordance with an exemplary embodiment of the present invention.

The cross-section of the light emitting diode described with reference to FIG. 4, FIG. 5, FIG. 6a, FIG. 6b, FIG. 7, FIG. 8, FIG. 9a, FIGS. 9b, and to 10 is a cross-section taken along line B-B' of FIG. 1.

Figure 4:
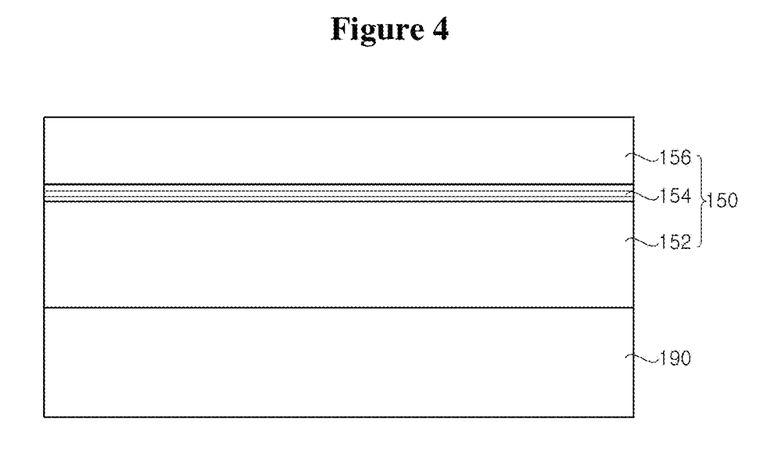
FIG. 4, FIG. 5, FIG. 6a, FIG. 6b, FIG. 7, FIG. 8, FIG. 9a, FIG. 9b, and FIG. 10 are sectional views, a perspective view, and an SEM image illustrating a method of fabricating a light emitting diode in accordance with an exemplary embodiment of the present invention.

Referring to FIG. 4, a substrate 190 is prepared. Any substrate may be used as a growth substrate without limitation so long as the substrate can grow a semiconductor structure 150 thereon. For example, the substrate 190 may be a sapphire substrate, a silicon carbide substrate, a gallium nitride substrate, a silicon substrate, or the like.

Next, a first conductivity-type semiconductor layer 152, an active layer 154, and a second conductivity-type semiconductor layer 156 are sequentially formed on the substrate 190 to form the semiconductor structure 150. The semiconductor structure 150 may be formed by growing the first conductivity-type semiconductor layer 152, the active layer 154, and the second conductivity-type semiconductor layer 156 using MOCVD (Metal Organic Chemical Vapor Deposition), MBE (Molecular Beam Epitaxy), HVPE (Hydride Vapor Phase Epitaxy), or the like. Prior to formation of the first conductivity-type semiconductor layer 152, a buffer layer (not shown) may be further formed in order to improve crystallinity of the semiconductor structure 150.

Figure 5:
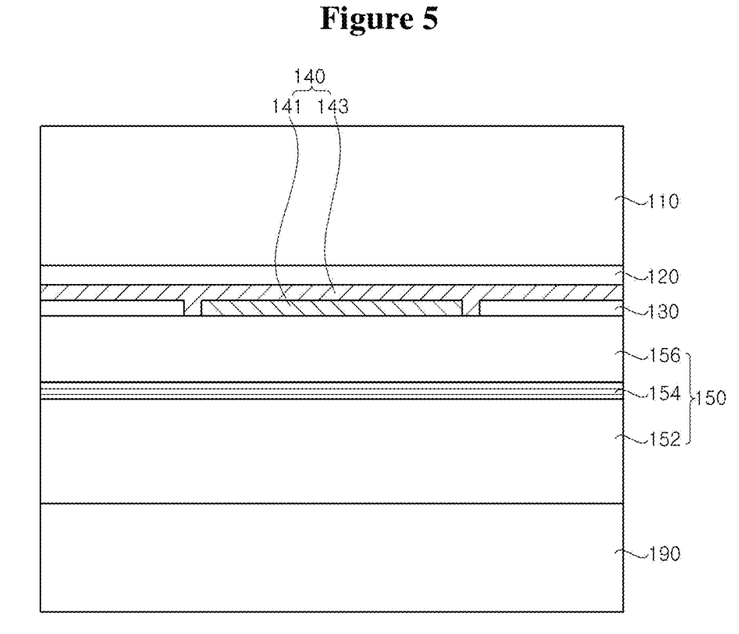

Next, referring to FIG. 5, an insulating pattern layer 130, a metal layer 140, a bonding layer 120, and a support substrate 110 may be formed on the semiconductor structure 150.

First, the insulating pattern layer 130 may be formed on a partial region of the second conductivity-type semiconductor layer 156. The formation of the insulating pattern layer 130 may be performed by depositing the insulating pattern layer 130 on the overall upper surface of the second conductivity-type semiconductor layer 156, followed by photolithography. The insulating pattern layer 130 may include, for example, $SiO_2$ or $SiN_x$.

A region on which the insulating pattern layer 130 is formed may be a region vertically corresponding to a region on which an electrode 180 will be formed, and a partial region on which the semiconductor structure 150 will be etched in a subsequent process to form a light-emitting element. Thus, as shown in FIG. 5, the insulating pattern layer 130 is arranged on an outer peripheral side surface of the substrate 190. Thus, the insulating pattern layer 130 may act as so an etching stop pattern layer which indicates an etch-stop point when the semiconductor structure 150 is etched.

The metal layer 140 may include a reflective metal layer 141 and a barrier metal layer 143. In the present exemplary embodiment, the reflective metal layer 141 is first formed and then the barrier metal layer 143 is formed thereon.

The reflective metal layer 141 may be partially formed on the second conductivity-type semiconductor layer 156. For example, the reflective metal layer 141 may be formed to be substantially coplanar with the insulating pattern layer 130, and may also be formed so as not to come into contact with the insulating pattern layer 130. The reflective metal layer 142 may be formed of a metallic material including at least one selected from among Ni, Pt, Pd, Rh, W, Ti, Al, Ag, and Au.

After the reflective metal layer 141 is formed, the barrier metal layer 143 is formed thereon. The barrier metal layer 143 prevents diffusion of the reflective metal layer 141 material, or diffusion of an external metal material, into the reflective metal layer 141, and vice versa. Thus, the barrier metal layer 143 may be formed so as to cover all of the upper surface and side surfaces of the reflective metal layer 141. Further, the barrier metal layer 143 may be formed so as to cover the insulating pattern layer 130.

The barrier metal layer 143 may be formed by deposition and the like, and may be formed of a metallic material including Ni and the like.

Next, the support substrate 110 may be formed on the barrier metal layer 143. When forming the support substrate 110, the bonding layer 120 is formed on the barrier metal layer 143 so as to bond the support substrate 110 to the semiconductor structure 150.

The support substrate 110 may be a conductive or insulating substrate. The support substrate 110 is described above in the exemplary embodiment with reference to FIG. 1, FIG. 2, and FIG. 3, and thus, a further description thereof will be omitted.

The bonding layer 120 may bond the support substrate 110 to the semiconductor structure 150, and may be formed of a conductive material so as to electrically connect the support substrate 110 to the second conductivity-type semiconductor layer 156.

The bonding layer 120 may be formed of any kind of material, such as a metallic material, so long as the material can bond the semiconductor structure 150 to the support substrate 110. The metal material may include AuSn. Since Au and Sn can form a eutectic structure together, the support substrate 110 can be eutectic-bonded to the semiconductor structure 150 by the bonding layer 120 including AuSn. The bonding process may be performed by heating, for example, AuSn having a composition of 80 wt % of Au and 20 wt % of Au to at least 280° C., which is a eutectic temperature, and then cooling AuSn to below the eutectic temperature.

Further, the bonding layer 120 including AuSn electrically connects the support substrate 110 to the second conductivity-type semiconductor layer 156.

Figure 6A:
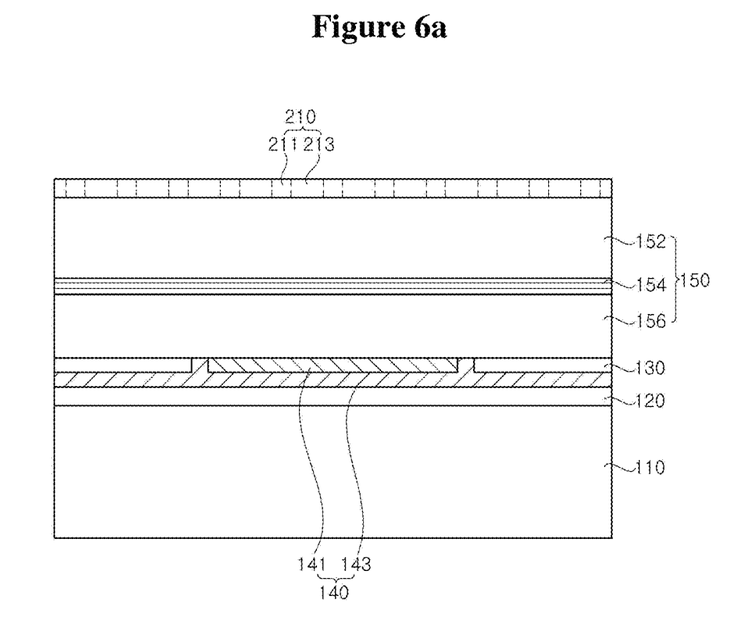

Referring to FIG. 6a, after the substrate 190 is separated, a mask pattern 210 is formed on one surface of the first conductivity-type semiconductor layer 152, which is opposite from the support substrate 110, that is, one surface of the first conductivity-type semiconductor layer 152 exposed when the substrate 190 is separated.

The substrate 190 may be separated from the semiconductor structure 150 using various methods, such as polishing, laser lift-off (LLO), chemical lift-off (CLO), stress lift-off (SLO), or the like. When the buffer layer (not shown) is formed between the first conductivity-type semiconductor layer 152 and the substrate 190, the buffer layer may be separated from the semiconductor structure 150 while the substrate 190 is separated.

When the substrate 190 is separated, one surface of the first conductivity-type semiconductor layer 152 is exposed. Exposure of the one surface of the semiconductor layer 152 may include removing a portion of the buffer layer (not shown) remaining on the exposed surface of the first conductivity-type semiconductor layer 152, and further include planarizing the one surface of the first conductivity-type semiconductor layer 152 using chemical mechanical polishing (CMP). However, a method of planarizing the one surface of the first conductivity-type semiconductor layer 152 is not limited thereto.

Next, the mask pattern 210 is formed on the exposed surface of the first conductivity-type semiconductor layer 152.

The mask pattern 210 includes a plurality of openings 211 and masking regions 213.

The openings 211 are regions surrounded by the masking regions 213, and a portion of the first conductivity-type semiconductor layer 152 may be exposed through the openings 211. In addition, the openings 211 may be separated from each other, and may have a variety of shapes.

Figure 6B:
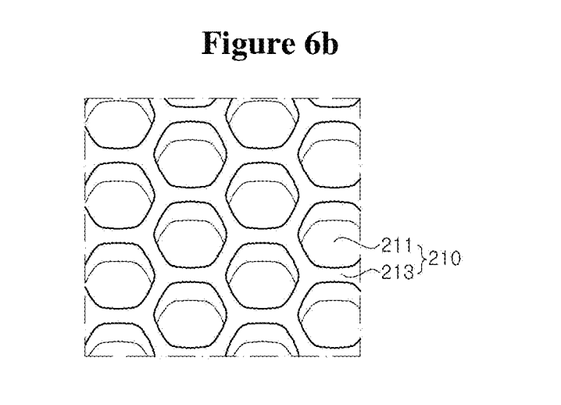

For example, FIG. 6b is a schematic perspective view of the mask pattern 210. As shown in FIG. 6b, the mask pattern 210 may include openings 211 and masking regions 213. Each of the openings 211 may have a hexagonal inlet. However, the openings may have various shapes, and in some cases, some openings may have different shapes from other openings. The size of the openings 211 and the distance between each opening 211 may be determined depending upon the size of and distance between portions of the first conductivity-type semiconductor layer 152 to be etched. For example, the openings 211 may have a center-to-center pitch of 6 μm.

The masking regions 213 cover a portion of the surface of the first conductivity-type semiconductor layer 152 exposed after the substrate 190 is separated. The first conductivity-type semiconductor layer 152 is partially masked by the masking regions 213. The masking regions 213 may be connected to each other. For example, as shown in FIG. 6b, the masking regions 213 may be connected to each other so as to surround the openings 211 separated from each other.

Since the light-emitting diode is fabricated using such a mask pattern 210 in which the masking regions 213 are connected to each other, the process of forming the mask pattern 210 may be stably performed. Further, since a contact area between the mask pattern 210 and the first conductivity-type semiconductor layer 152 increases and the mask pattern 210 has an integral structure, an etching process described below may also be stably performed. Further, since the mask pattern 210 can be stably disposed on the first conductivity-type semiconductor layer 152 by the masking regions 213 without being separated therefrom, the size of the openings 211 can be increased so as to enlarge a region of the first conductivity-type semiconductor layer 152 to be etched.

In the present exemplary embodiment, the mask pattern 210 may be formed of a material that can serve as a mask in an etching process described below. For example, the mask pattern 210 may be formed of a material comprising a photoresist, and other materials, such as $SiO_2$ or metallic materials.

Figure 7:
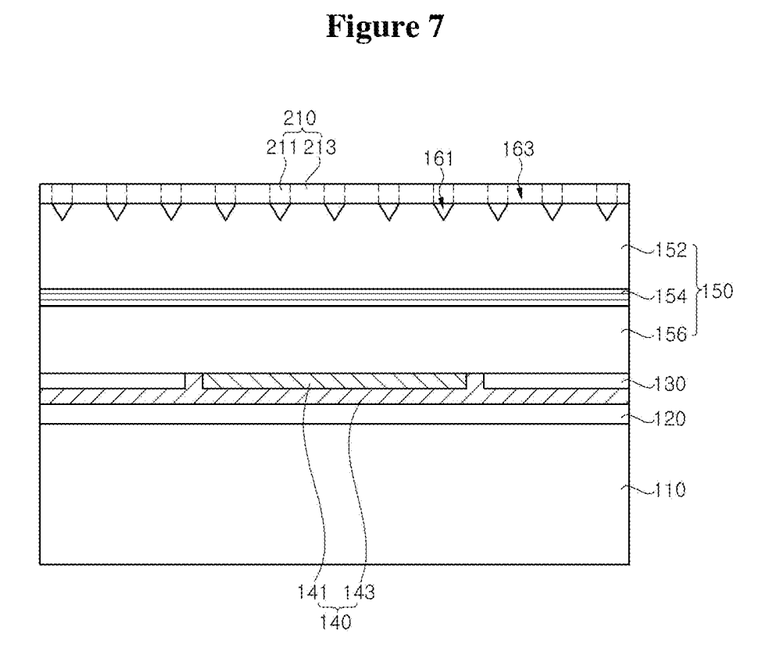

Next, referring to FIG. 7, a plurality of recesses 161 are formed by partially etching the exposed surface of the first conductivity-type semiconductor layer 152 on which the mask pattern 210 is formed.

Etching may be dry-etching, for example, reactive-ion etching (RIE). When the surface is polished so as to be planarized, wet-etching described below can be easily performed by dry etching the planarized surface.

With this etching process, a portion of the first conductivity-type semiconductor layer 152 exposed through the openings 211 of the mask pattern 210 is etched. After the etching process, the plurality of recesses 161 may be formed on one surface of the first conductivity-type semiconductor layer 152. The position of the recesses 161 may be determined by the mask pattern 210, and the shape, size and the like of the recesses 161 may be determined depending upon the shape of the mask pattern 210 and conditions of the etching process. For example, the recesses 161 may have a center-to-center pitch of 6 μm and an average depth of about 3 μm. Each of the recesses may have a circular or hexagonal inlet. Further, as shown, the recesses 161 may have a micro-cone shape. The micro-cone-shaped recesses may have a relatively gentle side slope, and may have, for example, a U-shape cross-section.

On the contrary, a region of the first conductivity-type semiconductor layer 152 located under the masking regions 213, that is, a region between the recesses 161, is not etched.

Figure 8:
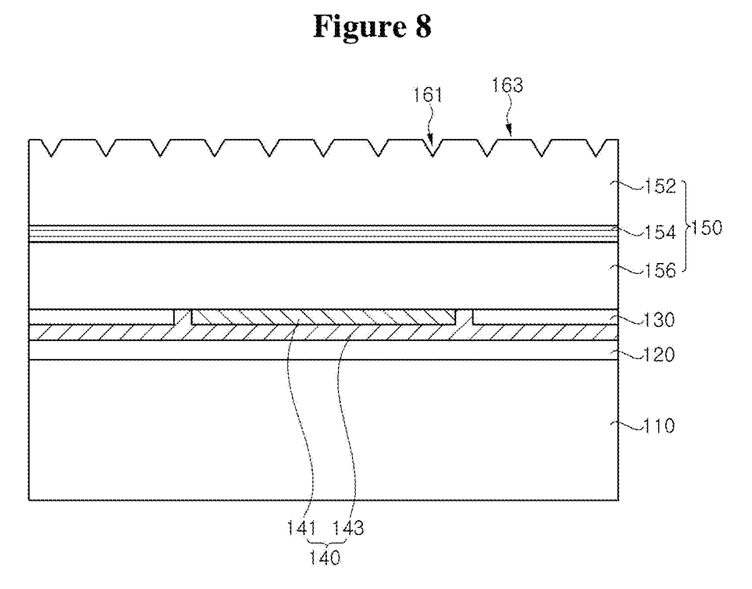

Referring to FIG. 8, the mask pattern 210 disposed on one surface of the first conductivity-type semiconductor layer 152 is removed. The mask pattern 210 may be removed using a chemical solution or plasma.

When the mask pattern 210 is removed, one surface of the first conductivity-type semiconductor layer 152 is exposed, and the first conductivity-type semiconductor layer 152 includes the plurality of recesses 161 and regions 163 between recesses 161 on the one surface thereof. Here, the recesses 161 may be separated from each other.

Figure 9A:
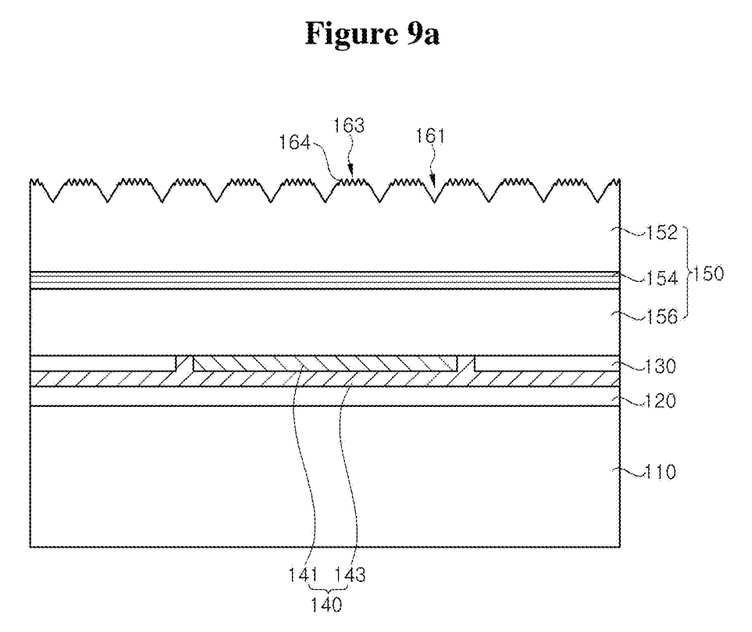
Figure 9B:
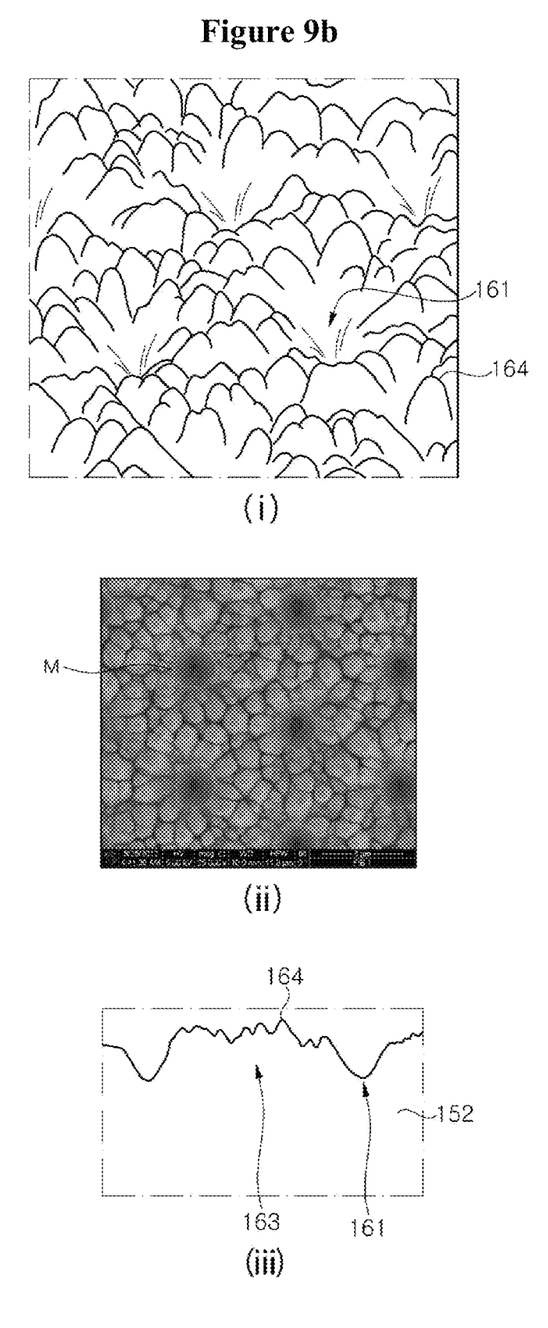

Referring to FIG. 9, the exposed surface of the first conductivity-type semiconductor layer 152 is wet-etched to form a sub-micro texture 164. In the present exemplary embodiment, the sub-micro texture 164 may include sub-micro cones.

Wet-etching may be photo-enhanced chemical (PEC) etching, or may be performed using a solution containing phosphoric-sulfuric acid.

At least one sub-micro texture 164 may be formed in a region 163 between the recesses. For example, FIG. 9b shows schematic figures and picture illustrating the surface of the first conductivity-type semiconductor layer 152. FIG. 9b(i) is a schematic perspective view showing the surface, and FIG. 9b(ii) is a SEM image showing an upper surface of the first conductivity-type semiconductor layer 152. Here, the area indicated by reference character M indicates a milling point, and FIG. 9b(iii) schematically shows a cross section of the milling point. As shown in FIG. 9b(iii), the region 163 between the recesses may be formed with a plurality of sub-micro cones. Alternatively, the sub-micro cones may be further formed on the bottom surfaces of the recesses 161. With the additional formation of the sub-micro cones on the bottom surfaces of the recesses 161, the sub-micro texture 164 may be formed over the whole surface of the first conductivity-type semiconductor layer 152. Accordingly, the light-emitting diode can have further improved light extraction efficiency.

The sub-micro cones may have various sizes according to conditions of wet-etching, and may have an average height of about 0.5 μm or less. The sub-micro cones may have a relatively steep side slope. For example, the sub-micro cones may have an inverted V-shape cross-section.

When the recesses 161 have a micro-conical shape and the sub-micro texture 164 includes sub-micro cones, each of the micro-conical recesses has a gentler side slope than the sub-micro cones. For example, as shown in FIG. 9b(iii), the micro-cone-shaped recesses may have a U-shaped cross-section, and the sub-micro cone may have an inverted V-shape cross-section. However, the recesses 161 and the sub-micro texture 164 may have various shapes.

As such, in the method of fabricating a light-emitting diode according to the present exemplary embodiment, since wet etching is performed after primary etching is performed to form a plurality of recesses, wet etching can be easily performed. Further, since surface roughness of the light-emitting diode is increased over a relatively wide area by wet etching, light extraction efficiency of the light emitting diode can be significantly improved.

Figure 10:
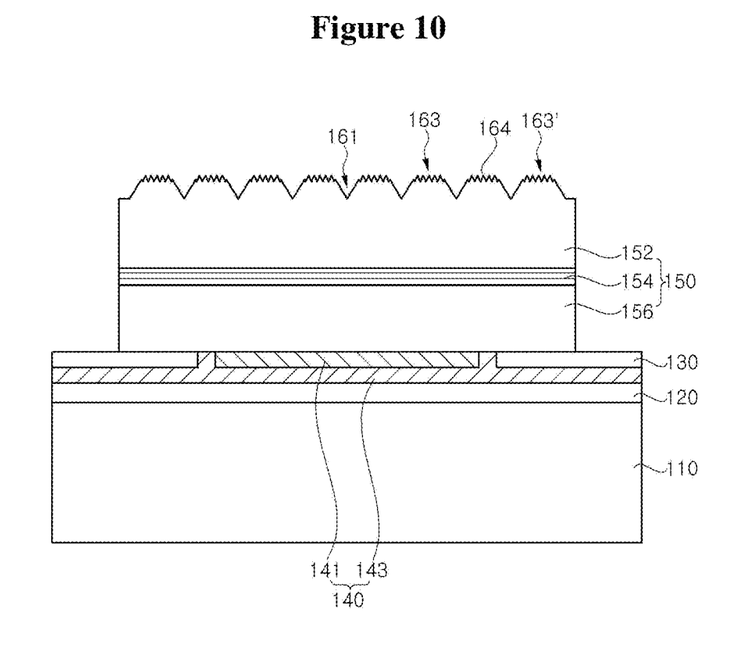

Referring to FIG. 10, a light emitting element comprising a semiconductor structure 150 may be formed by partially etching the first conductivity-type semiconductor layer 152, the active layer 154, and the second conductivity-type semiconductor layer 156. Here, the insulating pattern layer 130 may act as an etch-stop pattern layer indicating an etch-stop point.

Although the present exemplary embodiment is illustrated as forming a single light emitting element, a plurality of light emitting elements may be formed by patterning a plurality of regions according to the size of the support substrate 110.

Then, a passivation layer 170 is formed to cover the semiconductor structure 150. Here, the passivation layer 170 may be subjected to patterning such that an electrode forming region 163' can be exposed on the upper surface of the first conductivity-type semiconductor layer 152.

A portion of the passivation layer 170 formed on the upper surface of the first conductivity-type semiconductor layer 152 may be generally formed along the upper surface of the first conductivity-type semiconductor layer 152. That is, the passivation layer 170 may be formed to a shape generally corresponding to the concavo-convex shape of the recesses 161 and the sub-micro texture 164.

The surface of the passivation layer 170 formed on the sub-micro texture 164 may have a gentler slope than that of the sub-micro texture 164.

Further, during wet etching, the sub-micro texture 164 may be divided or combined with other sub-micro textures. The passivation layer 170 formed on the divided or combined sub-micro textures 164 may have a gently inclined surface in a region corresponding to the divided or combined sub-micro textures 164. In addition, the passivation layer 170 may have various thicknesses according to locations of the sub-micro cones under the passivation layer. For example, a portion of the passivation layer 170 disposed on an apex of the sub-micro cone may be thicker than a portion of the passivation layer 170 disposed on a side surface of the sub-micro cone. As a result, the slope of the cone shapes of the light extraction face becomes gentle, thereby further improving light extraction efficiency.

Next, an electrode extension 183 is formed on the electrode forming region 163', thereby providing a light emitting diode as shown in FIG. 3. The electrode extension 183 may be formed to cover the recesses 161.

Alternatively, the electrode forming region 163' may not be subjected to wet etching. An etching mask material may be further formed on the electrode forming region 163' before wet etching.

Exemplary embodiments of the present invention provide a light emitting diode which has improved light extraction efficiency through increased surface roughness by dry etching and wet etching on the surface of the light emitting diode, and a method of fabricating the same.

In addition, in fabrication of the light emitting diode having increased surface roughness, a mask pattern including masking regions connected to each other is used to form recesses, whereby the process of fabricating the light emitting diode can be stably performed while improving process yield.

Although the invention has been illustrated with reference to some embodiments in conjunction with the drawings, it will be apparent to those skilled in the art that various modifications and changes can be made to the invention without departing from the spirit and scope of the invention. Further, it should be understood that some features of a certain embodiment may also be applied to other exemplary embodiments without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light-emitting diode, comprising:
   a second conductivity-type semiconductor layer disposed on a support substrate;
   a first conductivity-type semiconductor layer disposed on the second conductivity-type semiconductor layer;
   an active layer disposed between the first conductivity-type semiconductor layer and the second conductivity-type semiconductor layer;
   a passivation layer disposed on the first conductivity-type semiconductor layer, the second conductivity-type semiconductor, and the active layer;
   an insulating pattern layer disposed on a first region of the support substrate; and
   an electrode pad disposed on the first conductivity-type semiconductor layer,
   wherein:
   the first conductivity-type semiconductor layer comprises a plurality of recesses spaced apart from each other and a sub-micro texture disposed on an uppermost surface of the first conductivity-type semiconductor layer opposite to the support substrate excluding the plurality of recesses;
   the passivation layer is disposed in the plurality of recesses and on the sub-micro texture of the first conductivity-type semiconductor layer;
   the electrode pad is disposed on a portion of the sub-micro texture and at least one of the plurality of recesses of the first conductivity-type semiconductor layer.

2. The light-emitting diode of claim 1, wherein the sub-micro texture comprises sub-micro cones.

3. The light-emitting diode of claim 2, wherein the passivation layer comprises at least one conical portion disposed on the sub-micro cones, the at least one conical portion comprising a gentler slope than the sub-micro cones.

4. The light-emitting diode of claim 2, wherein the plurality of recesses comprise micro-conical recesses each comprising a circular or hexagonal inlet.

5. The light-emitting diode of claim 4, wherein each micro conical recess comprises a gentler side slope than a side slope of the sub-micro cones.

6. The light-emitting diode of claim 5, wherein the micro conical recesses comprise a U-shape cross-section and the sub-micro cones comprise an inverted V-shape cross-section.

7. The light-emitting diode of claim 2, wherein the sub-micro cones comprise an average height of 0.5 µm or less.

8. The light-emitting diode of claim 1, wherein the at least one of the plurality of recesses and the uppermost surface of the first conductivity-type semiconductor layer form a concavo-convex shape.

9. The light-emitting diode of claim 1, further comprising a metal layer disposed between the second conductivity-type semiconductor layer and the support substrate.

10. The light-emitting diode of claim 9, wherein the metal layer comprises a reflective metal layer and a barrier metal layer,
    wherein the reflective metal layer is disposed on a second region of the support substrate, the barrier metal layer is disposed between the reflective metal layer and the insulating pattern layer and the support substrate, and the reflective metal layer and the insulating pattern layer are disposed on the barrier metal layer.

11. The light-emitting diode of claim 9, further comprising a bonding layer disposed between the support substrate and the metal layer.

12. The light-emitting diode of claim 1,
    wherein the electrode pad is disposed on a first region arranged above the insulating pattern layer.

13. The light-emitting diode of claim 12, further comprising an electrode extension extending from the electrode pad.

14. The light-emitting diode of claim 13, wherein the electrode extension is disposed on a second region arranged above the insulating pattern layer, the second region being spaced apart from the first region.

15. The light-emitting diode of claim 14, wherein the electrode extension is disposed on a peripheral side surface of the first conductivity-type semiconductor layer.

16. A light-emitting diode, comprising:
    a second conductivity-type semiconductor layer disposed on a support substrate;
    a first conductivity-type semiconductor layer disposed on the second conductivity-type semiconductor layer;
    an active layer disposed between the first conductivity-type semiconductor layer and the second conductivity-type semiconductor layer;
    a passivation layer disposed on the first conductivity-type semiconductor layer, the second conductivity-type semiconductor, and the active layer;
    an insulating pattern layer disposed on a first region of the support substrate;
    an electrode pad disposed on the first conductivity-type semiconductor layer; and
    an electrode extension extending from the electrode pad,
    wherein:
    the first conductivity-type semiconductor layer comprises a plurality of recesses spaced apart from each other and a sub-micro texture disposed on an uppermost surface of the first conductivity-type semiconductor layer opposite to the support substrate excluding the plurality of recesses;
    the passivation layer disposed on the first conductivity-type semiconductor layer is disposed in the plurality of recesses and on the sub-micro texture of the first conductivity-type semiconductor layer;
    the electrode pad is disposed on a portion of the sub-micro texture and at least one of the plurality of recesses of the first conductivity-type semiconductor layer;
    the electrode pad is disposed on a first region of the first conductivity-type semiconductor layer arranged over the insulating pattern layer; and
    the electrode extension is disposed on a second region of the first conductivity-type semiconductor layer arranged over the insulating pattern layer, the second region of the first conductivity-type semiconductor layer being spaced apart from the first region of the first conductivity-type semiconductor layer.

* * * * *